(12) United States Patent
Yasuda et al.

(10) Patent No.: US 10,490,740 B2
(45) Date of Patent: Nov. 26, 2019

(54) NON-VOLATILE MEMORY SYSTEM WITH RELIABILITY ENHANCEMENT MECHANISM AND METHOD OF MANUFACTURE THEREOF

(71) Applicant: Sony Semiconductor Solutions Corporation, Kanagawa (JP)

(72) Inventors: Shuichiro Yasuda, Boise, ID (US); Dale Collins, Boise, ID (US); Scott E. Sills, Boise, ID (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 410 days.

(21) Appl. No.: 13/963,796

(22) Filed: Aug. 9, 2013

(65) Prior Publication Data

US 2015/0041746 A1    Feb. 12, 2015

(51) Int. Cl.
*H01L 45/00*    (2006.01)

(52) U.S. Cl.
CPC ........ *H01L 45/085* (2013.01); *H01L 45/1233* (2013.01); *H01L 45/1266* (2013.01); *H01L 45/145* (2013.01); *H01L 45/146* (2013.01); *H01L 45/16* (2013.01)

(58) Field of Classification Search
None
See application file for complete search history.

(56) References Cited

U.S. PATENT DOCUMENTS

| | | | |
|---|---|---|---|
| 2009/0173930 A1* | 7/2009 | Yasuda | G11C 13/02 257/4 |
| 2010/0259967 A1* | 10/2010 | Yasuda | H01L 45/146 365/148 |
| 2011/0155987 A1* | 6/2011 | Mizuguchi et al. | 257/2 |
| 2011/0180775 A1* | 7/2011 | Lin et al. | 257/4 |
| 2012/0008369 A1* | 1/2012 | Shimuta et al. | 365/148 |
| 2012/0147689 A1 | 6/2012 | Scheuerlein et al. | |
| 2012/0163066 A1 | 6/2012 | Maejima | |
| 2012/0166901 A1 | 6/2012 | Kim | |
| 2012/0168706 A1 | 7/2012 | Noh et al. | |
| 2012/0211719 A1 | 8/2012 | Haimoto et al. | |
| 2013/0028003 A1* | 1/2013 | Wang et al. | 365/148 |

* cited by examiner

*Primary Examiner* — Andres Munoz
(74) *Attorney, Agent, or Firm* — Sheridan Ross P.C.

(57) ABSTRACT

A method of manufacture of a non-volatile memory system comprising: forming a dielectric layer having a hole; depositing a first electrode in the hole of the dielectric layer; applying an ion source layer over the first electrode; and depositing a second electrode over the ion source layer including: depositing an interface layer on the ion source layer, and applying a cap layer on the interface layer.

20 Claims, 3 Drawing Sheets

NON-VOLATILE MEMORY SYSTEM WITH RELIABILITY ENHANCEMENT MECHANISM AND METHOD OF MANUFACTURE THEREOF

TECHNICAL FIELD

The present invention relates generally to a memory system, and more particularly to a system for manufacturing individual cells in a non-volatile memory array.

BACKGROUND ART

The performance of non-volatile memory systems has improved over the past several years. Changes in technology management have pushed the non-volatile memory devices into cameras, computers, personal data assistants, smart phones, and proprietary business applications.

The current flash memory devices, based on charge storage technologies, have limited life spans due to damage of the charge storage layers during writes. The damage can be caused by physical weakening of the crystal structure used to store the charge. This condition is countered by limiting the number of writes and reads that an individual memory cell can undergo and balancing writes across all of the locations in the memory. The limited reliability of the cells has given rise to error correction strategies and distributed write operations in order to extend the useable life of the memory modules. Many maintenance processes can operate in background without the knowledge of the operator.

Other non-volatile memory technologies are in development that can increase the useable memory density while extending the lifetime reliability of the memory structures. These non-volatile memory technologies include spin transfer torque random access memory (STT-RAM) and resistive random access memory (R-RAM™).

In order to improve the reliability of the non-volatile memories, manufacturers have investigated storage element material changes. These material changes can trade-off performance versus reliability. A satisfactory solution has not yet been found that can meet performance expectations and maintain reliable operation over a suitable component lifetime.

These emerging memories often utilize new material and new structure. An issue that has arisen in the new R-RAM™ technology is that the layers of the storage cells can delaminate due to their different expansion/contraction characteristics. The delamination can cause a pseudo high resistance state regardless of the written state of the storage cells. Since the delamination issue is a regional problem and the storage cell geometry is very small, a delamination of the layers can damage hundreds or thousands of the storage cells in a single region.

Thus, a need still remains for a non-volatile memory system that can withstand aggressive thermal cycling and reliability testing. In view of the exponential growth in the use of non-volatile memory in personal electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

A method of manufacture of a non-volatile memory system including: forming a dielectric layer, such as a silicon nitride (SiN) layer or a silicon dioxide ($SiO_2$) layer, having a hole; depositing a first electrode in the hole of the dielectric layer; applying an ion source layer over the first electrode; and depositing a second electrode over the ion source layer including: depositing an interface layer on the ion source layer, and applying a cap layer on the interface layer.

A non-volatile memory system, including: a dielectric layer having a hole; a first electrode deposited in the hole of the dielectric layer; an ion source layer applied over the first electrode; and a second electrode deposited over the ion source layer including: an interface layer deposited on the ion source layer, and a cap layer applied on the interface layer.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
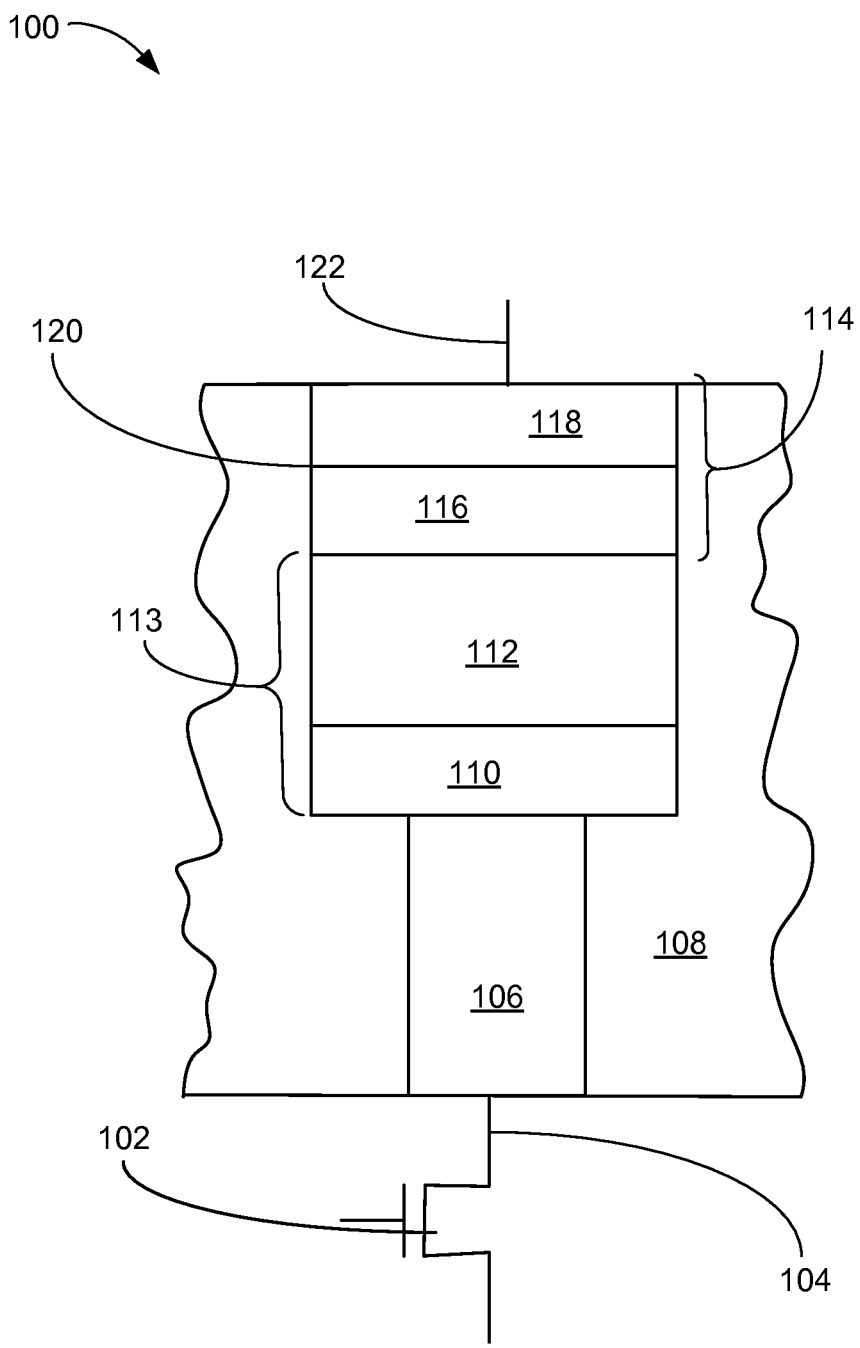
FIG. 1 is an architectural diagram of a non-volatile memory system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the active surface of the integrated circuit, having the non-volatile memory system, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The phrase "directly on" means that there is direct contact between elements with no intervening elements.

The term "processing" as used herein includes deposition of material or photoresist, patterning, exposure, development, etching, cleaning, and/or removal of the material or photoresist as required in forming a described structure. The phrase "resistive memory" is defined to be a semiconductor structure that is programmable between a low resistance state and a high resistance state.

Referring now to FIG. 1, therein is shown an architectural diagram of a non-volatile memory system 100 in a first embodiment of the present invention. The architectural diagram of a non-volatile memory system 100 depicts a control field effect transistor 102, such as a P-FET, coupled to a control interconnect 104. The control interconnect 104 can be coupled to first electrode 106, such as a bottom electrode.

The first electrode 106 can be formed in a dielectric layer 108, such as a silicon nitride (SiN) layer or a silicon dioxide ($SiO_2$) layer, by a combination of masking, etching, and deposition. The first electrode 106 can be a metal structure formed of metals or alloys including platinum (Pt), titanium nitride (TiN), Ruthenium (Ru), tungsten (W), or tungsten nitride (WN). The first electrode 106 can be deposited by physical vapor deposition (PVD), chemical vapor deposition (CVD), sputtering, plating, or metal layer deposition in an opening that was etched in the silicon nitride (SiN) layer 108. The choice of the material for the first electrode 106 is made to prevent an unintended transfer of ions into a memory switching layer 110.

The memory switching layer 110 can be formed by a deposition of an insulator material including gadolinium oxide ($Gd_2O_3$), aluminum oxide ($Al_2O_3$), silicon oxide ($Si_2O_3$) or the like on the first electrode 106. The memory switching layer 110 can provide a blocking layer that can accommodate nanostructure tunneling between an ion source layer 112 and the first electrode 106. The material of the memory switching layer 110 can be selected based on the base technology formed beneath the non-volatile memory system 100.

The ion source layer 112 can be deposited directly on the memory switching layer 110. The ion source layer 112 can be formed of alloys of Tellurium (Te), known as Telluride, including Copper telluride ($CuTe_x$), Aluminum telluride ($Al_2Te_x$), Zinc telluride ($ZnTe_x$), Nickel telluride ($Ni_2Te_x$), and Silver telluride ($Ag_2Te_x$). The covalent bonding in the ion source layer 112 can provide a source of free ions under conditions of elevated temperature or electric fields. The combination of the memory switching layer 110 and the ion source layer 112 can form a transformation layer 113. The transformation layer 113 can be manipulated, during operation, to reflect a low resistance state or a high resistance state.

A second electrode 114, such as a top electrode, can be formed over the ion source layer 112. The second electrode 114 can be formed of an interface layer 116 deposited directly on the ion source layer 112. The interface layer 116 can be formed by deposition of transition metals including titanium (Ti), silicon (Si), zirconium (Zr), or alloys, which includes any materials shown above.

The interface layer 116 can be deposited, on the ion source layer 112, to have a thickness in the range of between 1 nm and 2 nm. The thickness of the interface layer 116 being in the range of between 1 nm and 2 nm is key to maintaining the performance of the non-volatile memory system 100. The deposition of the interface layer 116 can occur at a manufacturing temperature in the range of 200-450 degrees Celsius. At this temperature the interface layer 116 can diffuse into the ion source layer 112 forming a chemical and mechanical bond.

It is understood that the material chosen for the interface layer 116 cannot be too reactive with the ion source layer 112. By way of an example materials such as Silver (Ag) and Copper (Cu) can be completely consumed by the ion source layer 112 when heated to the process temperature range of 200-450 degrees Celsius.

A cap layer 118 can be deposited on the interface layer 116. The cap layer 118 can be formed of low resistance metals or alloys including Tungsten (W), Tungsten Nitride (WN), Titanium (Ti), and Titanium Nitride (TiN). The cap layer 118 can be formed of multiple layers of metals or alloys, which are chemically isolated from the ion source layer 112. The multiple layers of the cap layer 118 can include layers of Tungsten (W), Copper (Cu), Aluminum (Al), Tantalum (Ta), or alloys thereof. It is understood that other combinations of metal or alloys can be deposited on the interface layer 116 in single or multiple layers in order to form the cap layer 118 having a thickness in the range of 2 nm to 30 nm.

A barrier structure 120 is formed by the coplanar surfaces of the interface layer 116 and the cap layer 118. The barrier structure 120 can be formed by a post-deposition anneal process saturated at 200-450 degrees Celsius. The post-deposition anneal process can be performed in a vacuum for a duration of 1-120 minutes.

The combination of the interface layer 116, the cap layer 118, and the barrier structure 120 forms the second electrode 114. A voltage reference interconnect 122, such as a Copper (Cu) or Aluminum (Al) trace, can be coupled to the second electrode 114 for providing the operational voltage required to operate the non-volatile memory system 100.

It has been discovered that the application of the interface layer 116, at a process temperature in the range of 200-450 degrees Celsius, can cause the interface layer 116 to diffuse into the ion source layer 112 for forming a chemical and mechanical bond that can prevent delamination of the second electrode 114 during operational stress. The application of the cap layer 118 on the interface layer 116 can provide the barrier structure 120, which can allow application of metals or alloys that would otherwise react with the ion source layer 112. This combination of the interface layer 116 and the cap layer 118 can provide a low resistance instance of the second electrode 114 that can be compatible with follow-on manufacturing processes, such as deposition of the voltage reference interconnect 122, while preventing delamination between the second electrode and the ion source layer 112.

Figure 2:
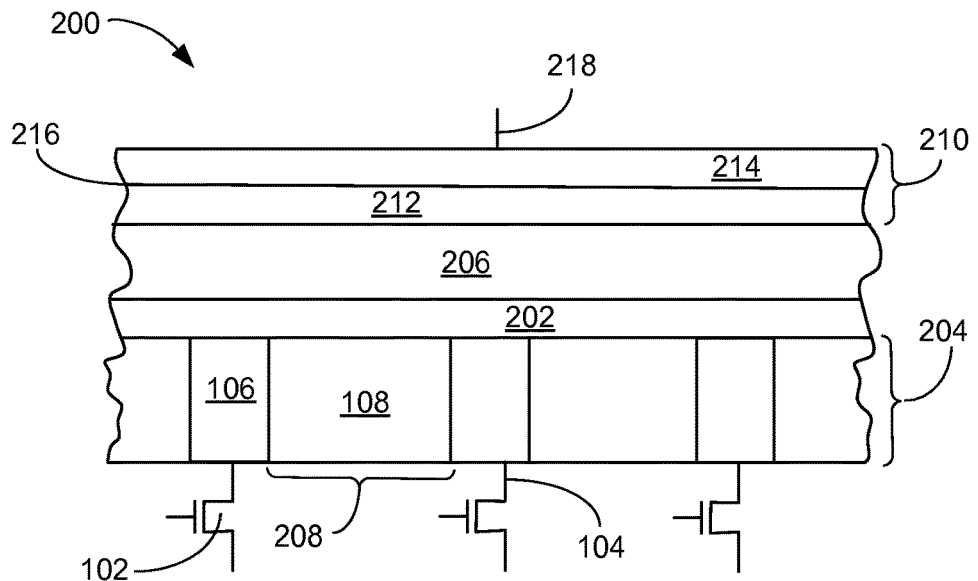
FIG. 2 is an architectural diagram of a non-volatile memory system in a second embodiment of the present invention.

Referring now to FIG. 2, therein is shown an architectural diagram of a non-volatile memory system 200 in a second embodiment of the present invention. The architectural diagram of a non-volatile memory system 200 depicts the control field effect transistor 102, such as a P-FET, coupled to the control interconnect 104. The control interconnect 104 can be coupled to the first electrode 106, such as a bottom electrode.

The first electrode 106 can be formed in the silicon nitride (SiN) layer 108 by a combination of masking, etching, and deposition. The first electrode 106 can be a metal structure formed of metals or alloys including Platinum (Pt), Titanium Nitride (TiN), Ruthenium (Ru), Tungsten (W), or Tungsten Nitride (WN). The first electrode can be deposited by chemical vapor deposition (CVD), sputtering, plating, or metal layer deposition in an opening etched in the silicon nitride (SiN) layer 108. The choice of the material for the first electrode 106 is made to prevent an unintended transfer of ions into an array memory switching layer 202.

The array memory switching layer 202 can be formed, to completely cover an array 204 of the first electrode 106, by a deposition of material including gadolinium oxide ($Gd_2O_3$), aluminum oxide ($Al_2O_3$), silicon oxide ($Si_2O_3$) or the like on the array 204 of the first electrode 106 and the silicon nitride (SiN) layer 108. The array memory switching layer 202 can provide an electrical blocking layer that can accommodate local nanostructure tunneling between an ion source layer 206 and the array 204 of the first electrode 106. The array memory switching layer 202 can allow the localized formation of the nanostructure tunneling over any of the first electrode 106 in the array 204 without having an effect on an adjacent instance of the first electrode 106. The localized nanostructure tunneling of the array memory switching layer 202 can provide an increase in density of the non-volatile memory system 200 by decreasing a cell-to-cell spacing 208 without increasing the manufacturing complexity of the non-volatile memory system 200.

The ion source layer 206 can be deposited on the array memory switching layer 202 to completely cover the array 204. The ion source layer 206 can be formed of alloys of Tellurium (Te), known as Telluride, including Copper telluride (CuTe), Aluminum telluride ($Al_2Te_3$), Zinc telluride (ZnTe), Nickel telluride ($Ni_2Te_3$), and Silver telluride ($Ag_2Te$). The covalent bonding in the ion source layer 206 can provide a source of free ions under conditions of elevated temperature or electric fields.

A common second electrode 210, such as an array top electrode, can be formed over the ion source layer 206. The common second electrode 210 can be formed of an interface sheet 212 deposited directly on the ion source layer 206. The interface sheet 212, such as a continuous sheet of the interface layer 116 of FIG. 1 to completely cover the array 204, can be formed by deposition of transition metals including titanium (Ti), silicon (Si), zirconium (Zr), Tungsten (W), or alloys thereof. The interface sheet 212 can be deposited, on the ion source layer 206, to have a thickness of less than 2 ηm. The thickness of the interface sheet 212 being less than 2 ηm is key to maintaining the performance of the non-volatile memory system 200. The deposition of the interface sheet 212 can occur at a manufacturing temperature in the range of 200-450 degrees Celsius. At this temperature the interface sheet 212 can diffuse into the ion source layer 206 forming a chemical and mechanical bond.

It is understood that the material chosen for the interface sheet 212 cannot be too reactive with the ion source layer 206. By way of an example materials such as Silver (Ag) and Copper (Cu) can be completely consumed by the ion source layer 206 when heated to the process temperature range of 200-450 degrees Celsius.

A cap layer 214 can be deposited on the interface sheet 212. The cap layer 214 can be formed of low resistance metals or alloys including Tungsten (W), Tungsten Nitride (WN), Titanium (Ti), and Titanium Nitride (TiN). The cap layer 214 can be formed of multiple layers of metals or alloys, which are chemically isolated from the ion source layer 206. The multiple layers of the cap layer 214 can include layers of Tungsten (W), Copper (Cu), Aluminum (Al), Tantalum (Ta), or alloys thereof. It is understood that other combinations of metal or alloys can be deposited on the interface sheet 212 in single or multiple layers in order to form the cap layer 214.

A barrier structure 216 is formed by the coplanar surfaces of the interface sheet 212 and the cap layer 214. The barrier structure 216 can be formed by a post-deposition anneal process saturated at 200-450 degrees Celsius. The post-deposition anneal process can be performed in a vacuum for a duration of 1-2 minutes.

The combination of the interface sheet 212, the cap layer 214, and the barrier structure 216 forms the common second electrode 210. A voltage reference interconnect 218, such as a Copper (Cu) or Aluminum (Al) trace, can be coupled to the common second electrode 210 for providing the operational voltage required to operate the non-volatile memory system 200. It is understood that the voltage reference interconnect 218 must be sufficiently large to provide an electric field that covers the entirety of the array 204, while only the instances of the first electrode 106 that are activated by the control field effect transistor 102 will require current from the voltage reference interconnect 218.

It has been discovered that the application of the interface sheet 212, at a process temperature in the range of 200-450 degrees Celsius, can cause the interface sheet 212 to diffuse into the ion source layer 206 for forming a chemical and mechanical bond that can prevent delamination of the common second electrode 210 during operational stress. The application of the cap layer 214 on the interface sheet 212 can provide the barrier structure 216, which can allow application of metals or alloys that would otherwise react with the ion source layer 206. This combination of the interface sheet 212 and the cap layer 214 can provide a low resistance of the common second electrode 210 that can be compatible with follow-on manufacturing processes, such as deposition of the voltage reference interconnect 218, while preventing delamination between the common second electrode 210 and the ion source layer 206. The fabrication of the common second electrode 210, over the ion source layer 206 and the array memory switching layer 202, can reduce the precision required to form the array 204 without impacting the operation of the non-volatile memory system 200.

Figure 3:
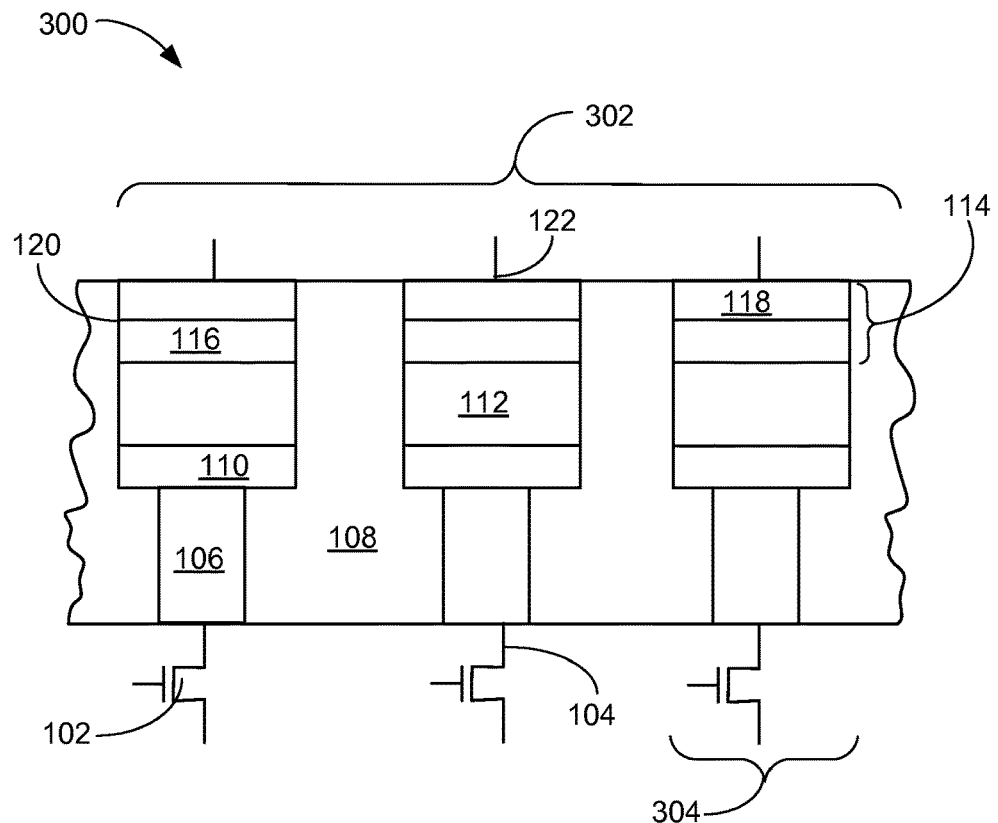
FIG. 3 is an architectural diagram of a non-volatile memory system in a third embodiment of the present invention.

Referring now to FIG. 3, therein is shown an architectural diagram of a non-volatile memory system 300 in a third embodiment of the present invention. The architectural diagram of a non-volatile memory system 300 depicts an array 302 of a non-volatile memory cell 304 that includes the control field effect transistor 102, such as a P-FET, coupled to the control interconnect 104. The control interconnect 104 can be coupled to the first electrode 106, such as a bottom electrode.

The first electrode 106 can be formed in the silicon nitride (SiN) layer 108 by a combination of masking, etching, and deposition. The first electrode 106 can be the metal structure formed of metals or alloys including platinum (Pt), titanium nitride (TiN), Ruthenium (Ru), tungsten (W), or tungsten nitride (WN). The first electrode 106 can be deposited by physical vapor deposition (PVD), chemical vapor deposition (CVD), sputtering, plating, or metal layer deposition in an opening that was etched in the silicon nitride (SiN) layer 108. The choice of the material for the first electrode 106 is made to prevent an unintended transfer of ions into the memory switching layer 110.

The memory switching layer 110 can be formed by the deposition of material including gadolinium oxide ($Gd_2O_3$), aluminum oxide ($Al_2O_3$), silicon oxide ($Si_2O_3$) or the like on the first electrode 106. The memory switching layer 110 can provide the blocking layer that can accommodate nanostructure tunneling between the ion source layer 112 and the first electrode 106. The material of the memory switching layer 110 can be selected based on the base technology formed beneath the non-volatile memory system 100.

The ion source layer 112 can be deposited on the memory switching layer 110. The ion source layer 112 can be formed of alloys of Tellurium (Te), known as Telluride, including Copper telluride (CuTe), Aluminum telluride ($Al_2Te_3$), Zinc telluride (ZnTe), Nickel telluride ($Ni_2Te_3$), and Silver telluride ($Ag_2Te$). The covalent bonding in the ion source layer 112 can provide a source of free ions under conditions of elevated temperature or electric fields.

A second electrode 114, such as a top electrode, can be formed over the ion source layer 112. The second electrode 114 can be formed of an interface layer 116 deposited directly on the ion source layer 112. The interface layer 116 can be formed by deposition of transition metals including titanium (Ti), silicon (Si), zirconium (Zr), Tungsten (W), or alloys thereof.

The interface layer 116 can be deposited, on the ion source layer 112, to have a thickness in the range of between 1 nm and 2 nm. The thickness of the interface layer 116 being in the range of between 1 nm and 2 nm is key to maintaining the performance of the non-volatile memory system 100. The deposition of the interface layer 116 can occur at a manufacturing temperature in the range of 200-450 degrees Celsius. At this temperature the interface layer 116 can diffuse into the ion source layer 112 forming a chemical and mechanical bond.

It is understood that the material chosen for the interface layer 116 cannot be too reactive with the ion source layer 112. By way of an example materials such as Silver (Ag) and Copper (Cu) can be completely consumed by the ion source layer 112 when heated to the process temperature range of 200-450 degrees Celsius.

A cap layer 118 can be deposited on the interface layer 116. The cap layer 118 can be formed of low resistance metals or alloys including Tungsten (W), Tungsten Nitride (WN), Titanium (Ti), and Titanium Nitride (TiN). The cap layer 118 can be formed of multiple layers of metals or alloys, which are chemically isolated from the ion source layer 112. The multiple layers of the cap layer 118 can include layers of Tungsten (W), Copper (Cu), Aluminum (Al), Tantalum (Ta), or alloys thereof. It is understood that other combinations of metal or alloys can be deposited on the interface layer 116 in single or multiple layers in order to form the cap layer 118.

A barrier structure 120 is formed by the coplanar surfaces of the interface layer 116 and the cap layer 118. The barrier structure 120 can be formed by a post-deposition anneal process saturated at 200-450 degrees Celsius. The post-deposition anneal process can be performed in a vacuum for a duration of 1-2 minutes.

The combination of the interface layer 116, the cap layer 118, and the barrier structure 120 forms the second electrode 114. A voltage reference interconnect 122, such as a Copper (Cu) or Aluminum (Al) trace, can be coupled to the second electrode 114 for providing the operational voltage required to operate the non-volatile memory system 100.

It has been discovered that the application of the interface layer 116 in the non-volatile memory cell 304, at a process temperature in the range of 200-450 degrees Celsius, can cause the interface layer 116 to diffuse into the ion source layer 112 for forming a chemical and mechanical bond that can prevent delamination of the second electrode 114 during operational stress. The application of the cap layer 118 on the interface layer 116 can provide the barrier structure 120 after the anneal process at 200-450 degrees Celsius, which can allow application of metals or alloys that would otherwise react with the ion source layer 112. This combination of the interface layer 116 and the cap layer 118 can provide a low resistance instance of the second electrode 114 that can be compatible with follow-on manufacturing processes, such as deposition of the voltage reference interconnect 122, while preventing delamination between the second electrode and the ion source layer 112.

Figure 4:
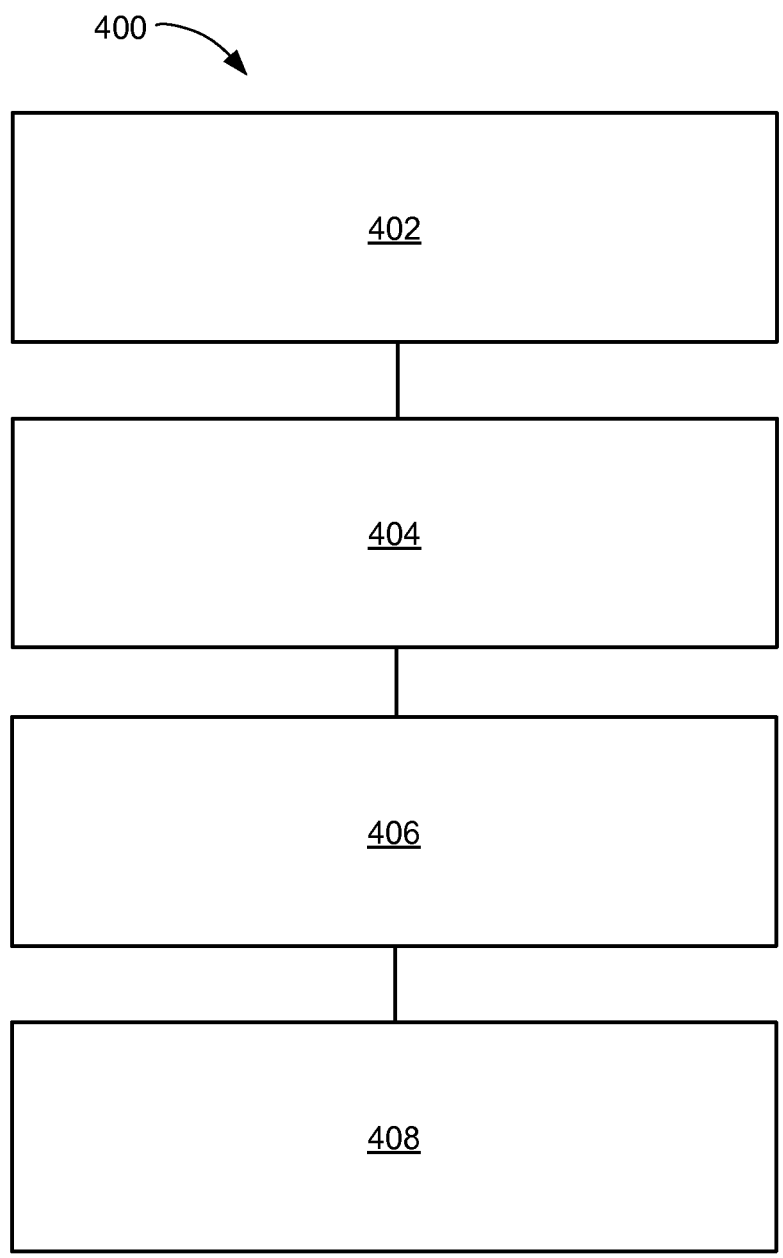
FIG. 4 is a flow chart of a method of operation of a non-volatile memory system in a further embodiment of the present invention.

Referring now to FIG. 4, therein is shown a flow chart of a method 400 of operation of a non-volatile memory system in a further embodiment of the present invention. The method 400 includes: forming a dielectric layer having a hole in a block 402; depositing a first electrode in the hole of the dielectric layer in a block 404; applying an ion source layer over the first electrode in a block 406; and depositing a second electrode over the ion source layer including: depositing an interface layer on the ion source layer, and applying a cap layer on the interface layer in a block 408.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a non-volatile memory system comprising:
   forming a dielectric layer having a hole therethrough;
   depositing a first electrode in the hole of the dielectric layer;
   applying a memory switching layer directly onto the first electrode such that the memory switching layer is in direct physical contact with the first electrode and the dielectric layer;
   applying an ion source layer directly onto the memory switching layer such that the ion source layer is in direct physical contact with the memory switching layer and the dielectric layer; and depositing a second electrode over the ion source layer, wherein depositing the second electrode over the ion source layer includes:
    depositing an interface layer on the ion source layer,
    applying a cap layer on the interface layer, and
    forming a barrier structure by annealing coplanar surfaces of the interface layer and the cap layer.

2. The method as claimed in claim 1, wherein applying the memory switching layer includes applying gadolinium oxide aluminum oxide, or silicon oxide.

3. The method as claimed in claim 1, further comprising applying a voltage reference interconnect on the second electrode and coupling a control interconnect to the first electrode for operating a non-volatile memory cell.

4. The method as claimed in claim 1, further comprising coupling a control field effect transistor to the first electrode including coupling a control interconnect between the control field effect transistor and the first electrode.

5. A non-volatile memory system comprising:
a dielectric layer having a hole;
a first electrode deposited in the hole of the dielectric layer;
a memory switching layer deposited in the hole and in direct physical contact with the first electrode and the dielectric layer;
an ion source layer in direct physical contact with the memory switching layer and the dielectric layer, and on a side of the memory switching layer opposite the first electrode; and
a second electrode including:
    an interface layer in direct physical contact with the ion source layer, wherein the interface layer is chemically and mechanically bonded to the ion source layer; and
    a cap layer in direct physical contact with the interface layer.

6. The system as claimed in claim 5, wherein the memory switching layer includes gadolinium oxide, aluminum oxide, or silicon oxide.

7. The system as claimed in claim 5, further comprising a voltage reference interconnect applied on the second electrode.

8. The system as claimed in claim 5, further comprising a control field effect transistor coupled to the first electrode.

9. The system as claimed in claim 5, further comprising a barrier structure formed by annealed coplanar surfaces of the interface layer and the cap layer.

10. The system as claimed in claim 5, wherein the interface layer has a thickness in a range of between 1 nm and 2 nm.

11. The system as claimed in claim 5, further comprising a voltage reference interconnect applied on the second electrode and a control interconnect coupled to the first electrode for operating a non-volatile memory cell.

12. The system as claimed in claim 5, further comprising a control field effect transistor coupled to the first electrode and a control interconnect between the control field effect transistor and the first electrode.

13. The system as claimed in claim 5, further comprising a barrier structure formed by annealed coplanar surfaces of the interface layer and the cap layer, with the cap layer heated to a range of 200-450 degrees Celsius for preventing a delamination of the second electrode.

14. The system as claimed in claim 5, wherein the interface layer is one of titanium, silicon, zirconium, or an alloy of titanium, silicon, and zirconium.

15. The system as claimed in claim 5, wherein the cap layer is one of tungsten, tungsten nitride, titanium, and titanium nitride.

16. The system as claimed in claim 5, wherein the dielectric layer includes silicon; wherein the first electrode includes a metal or alloy including platinum, titanium nitride, ruthenium, tungsten, or tungsten nitride; wherein the memory switching layer includes an insulating material including gadolinium oxide, aluminum oxide, or silicon oxide; wherein the ion source layer includes an alloy of tellurium; and wherein the interface layer includes titanium, silicon, or zirconium, or an alloy of titanium, silicon, and zirconium.

17. The system as claimed in claim 5, wherein the second electrode is in direct physical contact with the dielectric layer.

18. The system as claimed in claim 17, wherein the interface layer is in direct physical contact with the dielectric layer.

19. The system as claimed in claim 18, wherein the cap layer is in direct physical contact with the dielectric layer.

20. A non-volatile memory system comprising:
a dielectric layer having a hole;
a first electrode deposited in the hole of the dielectric layer;
a memory switching layer deposited in the hole and in direct physical contact with the first electrode and the dielectric layer;
an ion source layer in direct physical contact with the memory switching layer and the dielectric layer, and on a side of the memory switching layer opposite the first electrode; and
a second electrode including:
    an interface layer in direct physical contact with the ion source layer, wherein the interface layer is chemically and mechanically bonded to the ion source layer, and
    a cap layer in direct physical contact with the interface layer,
wherein,
    the first electrode, second electrode, memory switching layer, and ion source layer reside within the hole.

* * * * *